(12) United States Patent
Clevenger et al.

(10) Patent No.: US 8,232,211 B1
(45) Date of Patent: Jul. 31, 2012

(54) METHODS FOR SELF-ALIGNED SELF-ASSEMBLED PATTERNING ENHANCEMENT

(75) Inventors: Larry Clevenger, LaGrangeville, NY (US); Timothy J. Dalton, Ridgefield, CT (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/010,326

(22) Filed: Jan. 20, 2011

(51) Int. Cl.
*H01L 21/311* (2006.01)

(52) U.S. Cl. ......... 438/694; 257/E21.038; 257/E21.236; 257/E21.487; 430/270.1; 430/311; 430/323; 438/706; 438/712; 438/717

(58) Field of Classification Search ........... 257/E21.038, 257/E21.231, E21.236, E21.487; 430/270.1, 430/311, 323; 438/694, 706, 712, 717
See application file for complete search history.

(56) References Cited

U.S. PATENT DOCUMENTS

| | | | | |
|---|---|---|---|---|
| 2009/0042146 A1* | 2/2009 | Kim et al. | | 430/323 |
| 2009/0200646 A1* | 8/2009 | Millward et al. | | 257/632 |
| 2009/0308837 A1* | 12/2009 | Albrecht et al. | | 216/22 |

* cited by examiner

*Primary Examiner* — Asok Sarkar
(74) *Attorney, Agent, or Firm* — Hoffman Warnick LLC; Richard M. Kotulak

(57) ABSTRACT

Methods for producing self-aligned, self-assembled sub-ground-rule features without the need to use additional lithographic patterning. Specifically, the present disclosure allows for the creation of assist features that are localized and self-aligned to a given structure. These assist features can either have the same tone or different tone to the given feature.

18 Claims, 5 Drawing Sheets

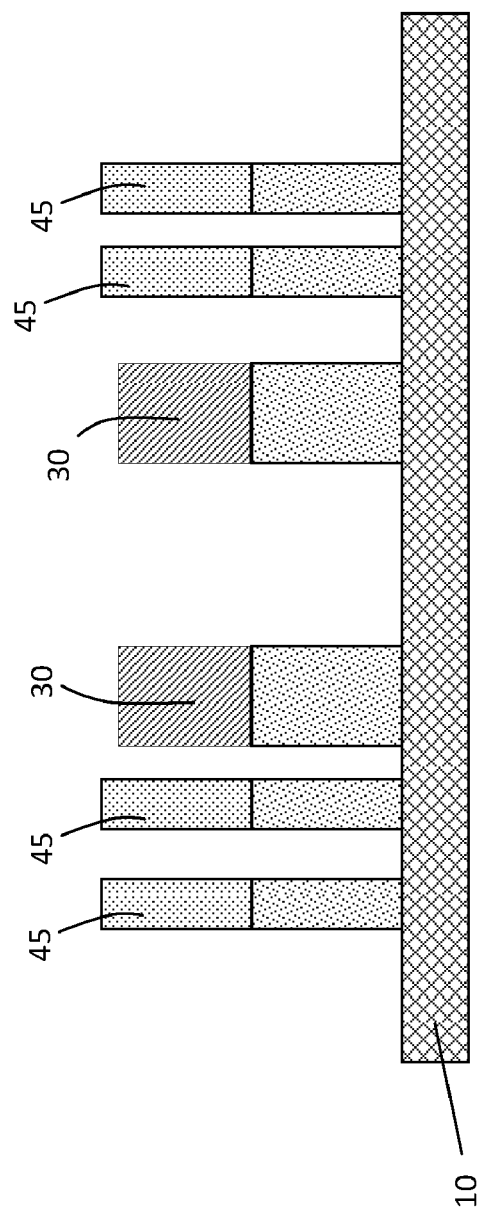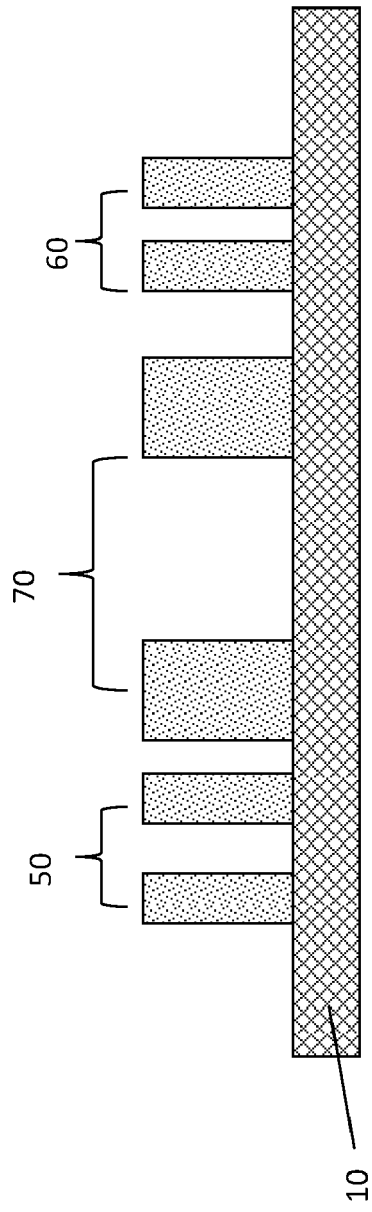

METHODS FOR SELF-ALIGNED SELF-ASSEMBLED PATTERNING ENHANCEMENT

BACKGROUND OF THE INVENTION

1. Technical Field

The invention relates generally to micro-scale or nano-scale device fabrication, and more particularly, to methods for forming a mask with self-aligned, self-assembled sub-lithographic features.

2. Background Art

A mask is a glass or quartz plate containing information about the features to be printed on a semiconductor wafer. This information is contained in variations in the plate that create differences in topography, transmittance or phase. The mask is used as a master template to transfer design images onto a wafer either through exposure to radiation (lithography) or through direct contact (nanoimprint). The mask is an intermediate step created to transfer the design to the wafer image, so the mask features are adjusted to create the desired wafer image.

A simple form of altering the mask data is to change the size or shape of the mask feature so that the printed wafer feature size matches the desired feature size and shape. A more complex change to the design is to add sub resolution features (SRAFs) that are too small to transfer to the wafer, but improve the printability of design features. The result is a large increase in very small features that are placed around design features. These small features challenge the resolution of the standard mask fabrication process. If small features are desired in a different material from the main feature, $1^{st}$-to-$2^{nd}$ pass pattern alignment is inadequate. These features also consume time in many ways. It takes time to generate sub resolution features and output mask data. The final mask data set is significantly larger than the input design data. The larger the data file size of the mask data, the slower the transfer of data, the slower the fracturing of the data into write-ready form, and the slower the mask fabrication process. If a problem is found with the sub resolution feature placement or size, the entire data processing sequence must be initiated again.

SUMMARY OF THE INVENTION

This disclosure presents methods for producing self-aligned, self-assembled sub-ground-rule features without the need to use additional lithographic patterning. Specifically, the present disclosure allows for the creation of assist features that are localized and self-aligned to a given structure. These assist features can either have the same tone or different tone to the given feature.

Aspects of the invention provide a method comprising: forming a structure over a mask substrate, the structure including at least one mask material; applying a self-assembly material on the structure; baking the self-assembly material to form at least one pattern that is self-aligned to the structure, the at least one pattern having sub-lithographic dimension; and transferring the structure and the at least one pattern to the mask substrate.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 1-9 show a cross section view of the mask illustrating methods of the present disclosure.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
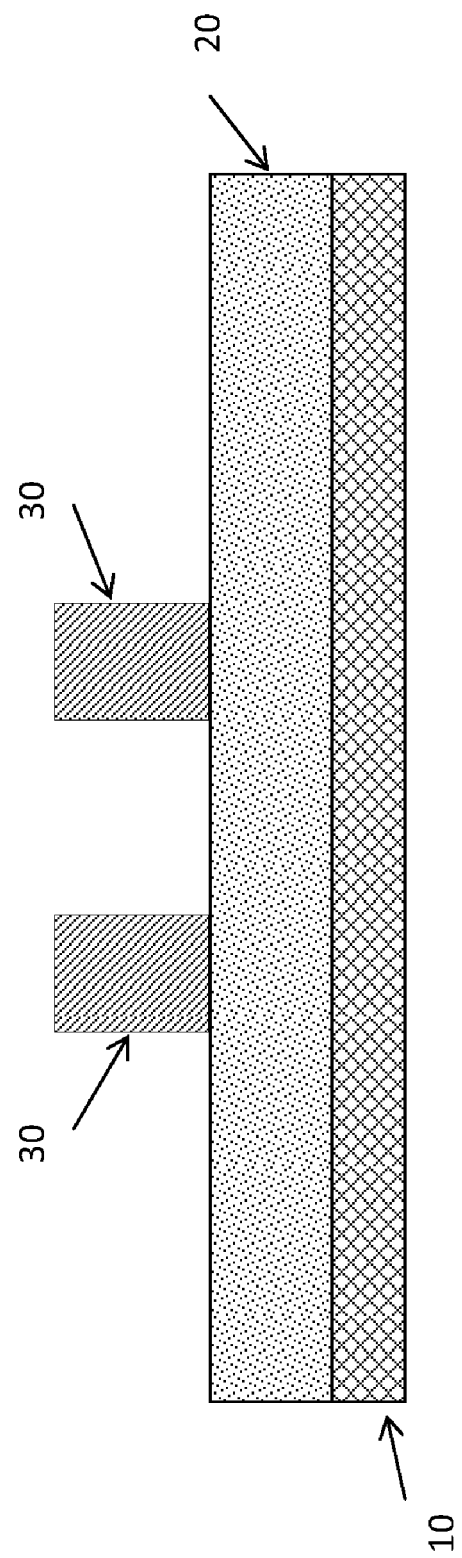
Figure 2:
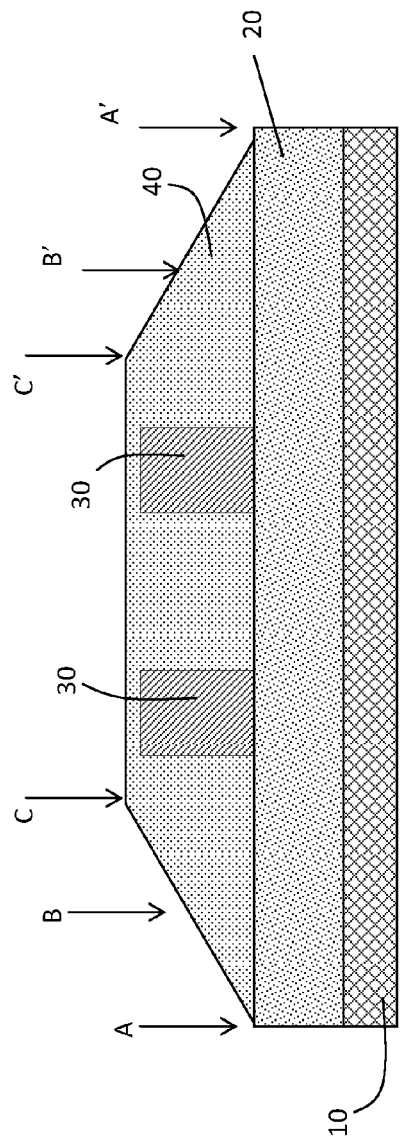

One approach in creating assist features is to begin with at least one mask patterned structure or structure 30 on top of a mask substrate 10 as shown in FIG. 1. Optionally, an image transfer material 20 may also be provided between the substrate and the patterned structures. Image transfer material 20 can be a temporary material used to transfer the pattern into mask substrate 10. Hard mask structure 30 is patterned using conventional techniques such as e-beam lithography. As demonstrated in FIG. 2, a self-assembly material 40, such as diblock copolymer, is spin coated in such a manner that the thickness of the copolymer layer varies from being thickest right next to structure 30, and being thinner as the distance away from the feature is increased. The spin speed and viscosity of the diblock is chosen so that the diblock thickness is in the right range for self-assembly to occur only between regions B and C, and B' and C', as show in FIG. 2. For sections between regions A and B, C and C', and B' and A' of FIG. 2, the diblock is of the incorrect thickness (too thin) for self assembly to occur. Accordingly, only sections of the copolymer layer adjacent to structure 30 will assemble.

There are many different types of block copolymers that can be used for practicing the present invention. As long as a block copolymer contains two or more different polymeric block components that are not immiscible with one another, such two or more different polymeric block components are capable of separating into two or more different phases on a nanometer scale and thereby form patterns of isolated nano-sized structural units under suitable conditions.

In one embodiment of the present invention, the block copolymer consists essentially of first and second polymeric block components A and B that are immiscible with each other. The block copolymer may contain any numbers of the polymeric block components A and B arranged in any manner. The block copolymer can have either a linear or a branched structure. Preferably, such a block polymer is a linear diblock copolymer having the formula of A-B. Further, the block copolymer can have any one of the following formula:

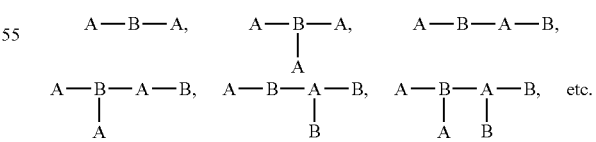

Specific examples of suitable block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

The specific structural units formed by the block copolymer are determined by the molecular weight ratio between the first and second polymeric block components A and B. For example, when the ratio of the molecular weight of the first polymeric block component A over the molecular weight of the second polymeric block component B is greater than about 80:20, the block copolymer will form an ordered array of spheres composed of the second polymeric block component B in a matrix composed of the first polymeric block component A. When the ratio of the molecular weight of the first polymeric block component A over the molecular weight of the second polymeric block component B is less than about 80:20 but greater than about 60:40, the block copolymer will form an ordered array of cylinders composed of the second polymeric block component B in a matrix composed of the first polymeric block component A. When the ratio of the molecular weight of the first polymeric block component A over the molecular weight of the second polymeric block component B is less than about 60:40 but is greater than about 40:60, the block copolymer will form alternating lamellae composed of the first and second polymeric block components A and B. Therefore, the molecular weight ratio between the first and second polymeric block components A and B can be readily adjusted in the block copolymer of the present invention, in order to form desired structural units.

In one embodiment of the present invention, the ratio of the molecular weight of the first polymeric block component A over the molecular weight of the second polymeric block component B ranges from about 80:20 to about 60:40, so that the block copolymer of the present invention will form an ordered array of lines composed of the second polymeric block component B in a matrix composed of the first polymeric block component A.

Preferably, one of the components A and B can be selectively removable relative to the other, thereby resulting in either isolated and orderly arranged structural units composed of the un-removed component, or a continuous structural layer containing isolated and orderly arranged cavities or trenches left by the removable component.

Figure 3:
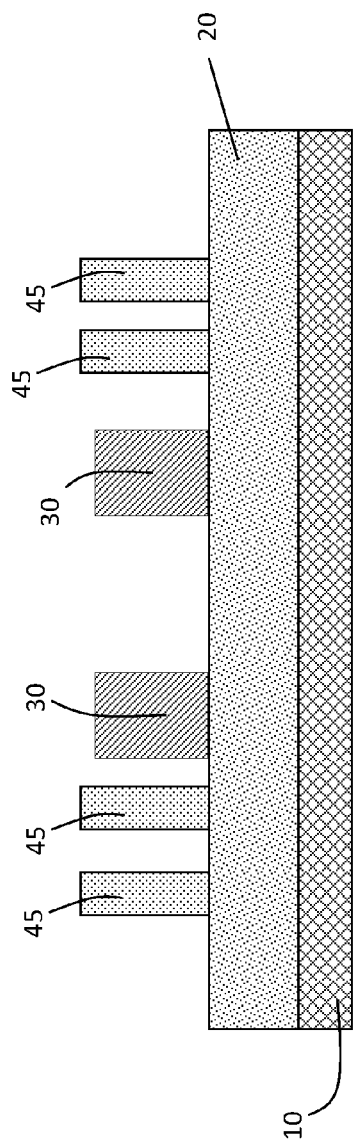

FIG. 3 shows an unremovable component 45 of the block copolymer, i.e., an assembled portion. It is noted that although the instant embodiment illustrates the formation of a line/space pattern, the present invention is not limited to the same. Since self-assembled block copolymers are used in the inventive method, each repeating unit has a width of about 50 nm or less. Other types of patterns that can be patterned/formed include, for example, spheres, cylinders, or lamellae.

In one embodiment of the present invention, the block copolymer used for forming the self-assembled periodic patterns of the present invention is PS-b-PMMA with a PS:PMMA molecular weight ratio ranging from about 80:20 to about 60:40.

Typically, mutual repulsion between different polymeric block components in a block copolymer is characterized by the term $\chi N$, where $\chi$ is the Flory-Huggins interaction parameter and N is the degree of polymerization. The higher $\chi N$, the higher the repulsion between the different blocks in the block copolymer, and the more likely the phase separation therebetween. When $\chi N > 10$ (which is hereinafter referred to as the strong segregation limit), there is a strong tendency for the phase separation to occur between different blocks in the block copolymer.

For a PS-b-PMMA diblock copolymer, $\chi$ can be calculated as approximately $0.028 + 3.9/T$, where T is the absolute temperature. Therefore, $\chi$ is approximately 0.0362 at 473K ($\approx 200°$ C.). When the molecular weight (Mn) of the PS-b-PMMA diblock copolymer is approximately 64 Kg/mol, with a molecular weight ratio (PS:PMMA) of approximately 66:34, the degree of polymerization N is about 622.9, so $\chi N$ is approximately 22.5 at 200° C.

In this manner, by adjusting one or more parameters such as the composition, the total molecular weight, and the annealing temperature, the mutual compulsion between the different polymeric block components in the block copolymer of the present invention can be readily controlled to effectuate desired phase separation between the different block components. The phase separation in turn leads to formation of self-assembled periodic patterns containing ordered arrays of repeating structural units (i.e., spheres, lines, cylinders, or lamellae), as described hereinabove.

In order to form the self-assembled periodic patterns, the block copolymer is first dissolved in a suitable solvent system to form a block copolymer solution, which is then applied onto a surface to form a thin block copolymer layer, followed by annealing of the thin block copolymer layer, thereby effectuating phase separation between different polymeric block components contained in the block copolymer.

The solvent system used for dissolving the block copolymer and forming the block copolymer solution may comprise any suitable solvent, including, but not limited to toluene, propylene glycol monomethyl ether acetate (PGMEA), propylene glycol monomethyl ether (PGME), and acetone. The block copolymer solution may contain the block copolymer at a concentration ranging from about 0.1% to about 2% by total weight of the solution. More specifically, the block copolymer solution may contain the block copolymer at a concentration ranging from about 0.5 wt % to about 1.5 wt %. In one embodiment of the present invention, the block copolymer solution comprises about 0.5 wt % to about 1.5 wt % PS-b-PMMA dissolved in toluene or PGMEA.

The block copolymer solution can be applied to the surface of a device structure by any suitable techniques, including, but not limited to spin casting, coating, spraying, ink coating, dip coating, etc. Preferably, the block copolymer solution is spin cast onto the surface of a device structure to form a thin block copolymer layer thereon.

After application of the thin block copolymer layer onto the device surface, the entire device structure is annealed to effectuate micro-phase segregation of the different block components contained by the block copolymer, thereby forming the periodic patterns with repeating structural units.

The annealing of the block copolymer can be achieved by various methods known in the art, including, but not limited to thermal annealing (either in a vacuum or in an inert atmosphere containing nitrogen or argon), ultra-violet annealing, laser annealing, solvent vapor-assisted annealing (either at or above room temperature), and supercritical fluid-assisted annealing, which are not described in detail here in order to avoid obscuring the invention.

In one embodiment of the present invention, a thermal annealing step is carried out to anneal the block copolymer layer at an elevated annealing temperature that is above the glass transition temperature (Tg) of the block copolymer, but below the decomposition or degradation temperature (Td) of the block copolymer. More preferably, the thermal annealing includes an annealing temperature of about 200° C.-300° C. The thermal annealing may last from less than about 1 hour to about 100 hours, and more typically from about 1 hour to about 15 hours.

In an alternative embodiment of the present invention, the block copolymer layer is annealed by ultra-violet (UV) treatment.

Following the anneal process, one of the components of the block copolymer can be removed utilizing a solvent that is selective to that component relative to the other component of the block copolymer. The type of solvent may vary and can be, for example, selected from the following list: polar and aprotic solvents.

After the self-assembly material 40 is spin-coated as discussed above, the self-assembly material 40 is then baked. As shown in FIG. 3, after bake, the diblock copolymer forms patterns 45 that are self-aligned to mask material 30. Patterns 45 are then transferred to image transfer material 20 using anisotropic etching methods, such as reactive ion etching (RIE), as shown in FIG. 4. If there is no image transfer material 20, then the image pattern is transferred directly into mask substrate 10.

Figure 6:
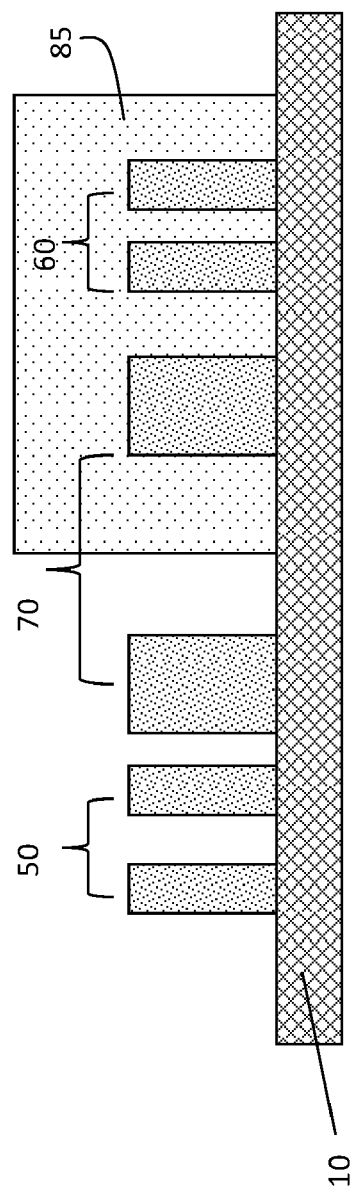

As shown in FIG. 5, the remaining polymer is then removed, leaving regions 50, 60 and 70, using any now known or later developed techniques. A masking layer may then be patterned using conventional techniques and placed over the mask 50, 60, 70 to cover the desired regions. For example, as shown in FIG. 6, layer 85 is positioned such that region 50 and a portion of region 70 are uncovered, while a portion of region 70 and all of region 60 are covered.

Figure 7:
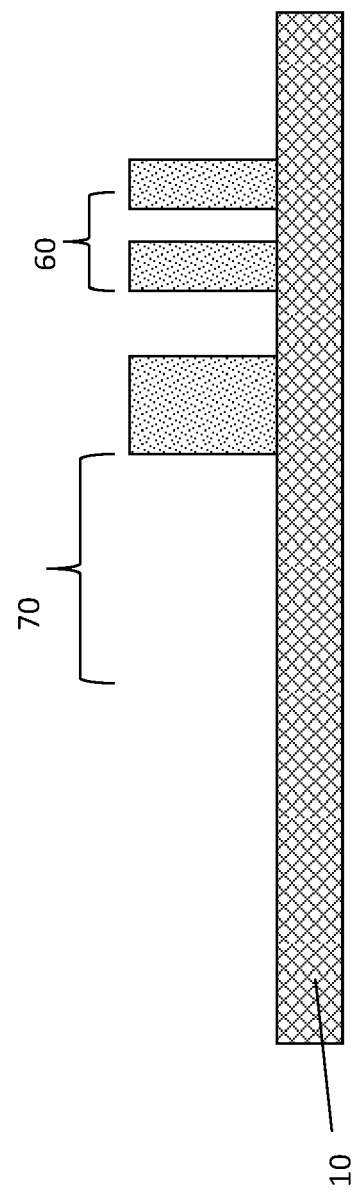

Masking layer 85 then will protect the covered patterns during etching. As shown in FIG. 7, after etching, only region 60 and a portion of region 70 remain. Masking layer 85 can then be removed, leaving a portion of region 70 which includes a structure patterned using conventional techniques, and region 60 which includes structures formed by self-assembly technique.

Figure 8:
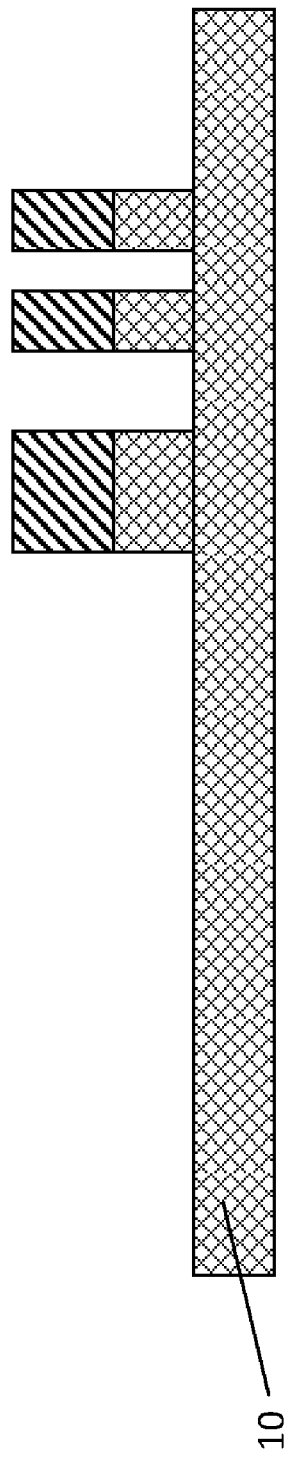
Figure 9:
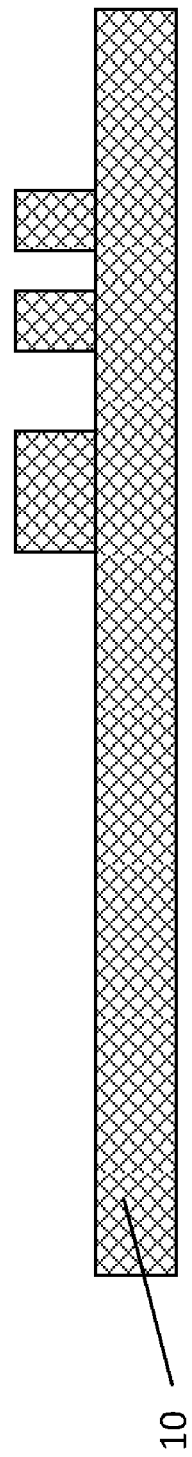

Turning to FIG. 8, the image of the structure is at least partially transferred into mask substrate 10. Mask substrate 10 could include a quartz mask plate including, but not limited to: photo mask blank, glass, doped-glass, sapphire, e-beam mask, x-ray mask, or other patterning mask. Then, as shown in FIG. 9, after the structures are stripped away, a mask is left with the desired shape.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method comprising:
    forming a structure over a temporary image transfer material which is provided over a mask substrate, the structure including at least one mask material;
    applying a self-assembly material on the structure;
    baking the self-assembly material to form at least one pattern that is self-aligned to the structure, the at least one pattern having sub-lithographic dimension; and
    transferring the structure and the at least one pattern to the mask substrate.

2. The method of claim 1, further comprising transferring the at least one pattern to the image transfer material layer.

3. The method of claim 2, further comprising patterning a masking layer to cover at least a portion of the at least one pattern.

4. The method of claim 3, further comprising etching to remove at least a portion of the at least one pattern not covered by the masking layer.

5. The method of claim 1, further comprising transferring the image of the at least one pattern and the mask feature to the mask substrate.

6. The method of claim 1, wherein the mask material is selected from the group consisting of: a quartz mask plate, a photo mask blank, a glass, a doped-glass, a sapphire, an e-beam mask and an x-ray mask.

7. The method of claim 1, wherein the self-assembly material is selected from the group consisting of: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

8. The method of claim 1, wherein the self-assembly material includes a polystyrene-polymethylmethacrylate (PS-PMMA) having a molecular weight ratio ranging from about 80:20 to about 60:40.

9. The method of claim 1, wherein the self-assembly material applying includes spin coating such that a thickness of the self-assembly material is thickest next to the structure.

10. A method comprising:
    providing a mask substrate;
    forming a temporary image transfer material layer over the mask substrate;
    forming a structure over the image transfer material, the structure including at least one mask material;
    applying a self-assembly material on the structure;
    baking the self-assembly material to form at least one pattern that is self-aligned to the structure, the at least one pattern having sub-lithographic dimension; and
    transferring the structure and the at least one pattern to the mask substrate and the image transfer material layer.

11. The method of claim 10, further comprising patterning a masking layer to cover at least a portion of the at least one pattern.

12. The method of claim 11, further comprising etching to remove at least a portion of the at least one pattern not covered by the masking layer.

13. The method of claim 10, wherein the mask material is selected from the group consisting of: a quartz mask plate, a photo mask blank, a glass, a doped-glass, a sapphire, an e-beam mask and an x-ray mask.

14. The method of claim 10, wherein the self-assembly material is selected from the group consisting of: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

15. The method of claim 10, wherein the self-assembly material includes a polystyrene-polymethylmethacrylate (PS-PMMA) having a molecular weight ratio ranging from about 80:20 to about 60:40.

16. The method of claim 10, wherein the self-assembly material applying includes spin coating such that a thickness of the self-assembly material is thickest next to the structure.

17. A method comprising:
 providing a mask substrate;
 forming an image transfer material layer over the mask substrate;
 forming a structure over the image transfer material, the structure including at least one mask material selected from the group consisting of: a quartz mask plate, a photo mask blank, a glass, a doped-glass, a sapphire, an e-beam mask and an x-ray mask;
 spin coating a self-assembly material on the structure, the self-assembly material including a polystyrene-polymethylmethacrylate (PS-PMMA) having a molecular weight ratio ranging from about 80:20 to about 60:40, wherein a thickness of the self-assembly material is thickest next to the structure;
 baking the self-assembly material to form at least one pattern that is self-aligned to the structure, the at least one pattern having sub-lithographic dimension;
 patterning a masking layer to cover at least a portion of the at least one pattern;
 etching to remove at least a portion of the at least one pattern not covered by the masking layer; and
 transferring the structure and the at least one pattern to the mask substrate and the image transfer material layer.

18. The method of claim 17, wherein the self-assembly material is selected from the group consisting of: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

* * * * *